United States Patent
Cho et al.

(10) Patent No.: US 11,960,212 B2
(45) Date of Patent: Apr. 16, 2024

(54) EXTREME ULTRAVIOLET LITHOGRAPHY DEVICE AND METHOD OF OPERATING EXTREME ULTRAVIOLET LITHOGRAPHY DEVICE

(71) Applicant: SAMSUNG ELECTRONICS CO., LTD., Suwon-si (KR)

(72) Inventors: Hoduk Cho, Suwon-si (KR); Seongbo Shim, Suwon-si (KR); Hyungjong Bae, Suwon-si (KR); Chan Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/088,364

(22) Filed: Dec. 23, 2022

(65) Prior Publication Data
US 2023/0393484 A1 Dec. 7, 2023

(30) Foreign Application Priority Data

Jun. 3, 2022 (KR) .................. 10-2022-0068201

(51) Int. Cl.
*G03F 7/00* (2006.01)
(52) U.S. Cl.
CPC .......... *G03F 7/702* (2013.01); *G03F 7/70116* (2013.01); *G03F 7/70504* (2023.05)
(58) Field of Classification Search
CPC .. G03F 7/702; G03F 7/70116; G03F 7/70504; G03F 7/70; G03F 7/70091; G03F 7/70125; G03F 7/70133; G03F 7/70141; G03F 7/7015–70183; G03F 7/70191; G03F 7/70208; G03F 7/70483–70541; G03F 7/7055; G03F 7/70558; G03F 7/70583; G03F 7/70591; G03F 7/706;
(Continued)

(56) References Cited

U.S. PATENT DOCUMENTS

| 6,134,702 A | 10/2000 | Scepanovic et al. |
| 8,395,754 B2 | 3/2013 | Endres et al. |

(Continued)

FOREIGN PATENT DOCUMENTS

| CN | 113419407 A | * | 9/2021 |
| KR | 1020210122845 A | | 10/2021 |

(Continued)

OTHER PUBLICATIONS

English translation of CN113419407, published Sep. 21, 2021. (Year: 2021).*

(Continued)

*Primary Examiner* — Christina A Riddle
(74) *Attorney, Agent, or Firm* — Sughrue Mion, PLLC

(57) ABSTRACT

An operating method of an extreme ultraviolet (EUV) lithography device includes defining a target image to render an illumination system, assigning priorities to respective positions of facets of a pupil facet mirror corresponding to the target image, assigning a mirror according to the assigned priorities using linear programming, generating the illumination system by selecting one of the facets of the pupil facet mirror based on a symmetry criterion, and converting mirror assignment information and source map information corresponding to the selected facet into a form recognizable by an EUV scanner.

20 Claims, 10 Drawing Sheets

(58) Field of Classification Search
CPC .......... G03F 7/70605–706851; G03F 7/70975;
G03F 7/70941; G06F 17/12; G06F 17/16
USPC ............. 355/18, 30, 52–55, 67–77; 359/838,
359/850–863, 871, 872–881, 904;
250/492.1–492.2, 492.22, 492.23, 493.1,
250/494.1, 503.1, 504 R
See application file for complete search history.

(56) References Cited

U.S. PATENT DOCUMENTS

| | | | |
|---|---|---|---|
| 9,411,239 B2 | 8/2016 | Fischer | |
| 9,551,938 B2 | 1/2017 | Matsuyama et al. | |
| 10,191,384 B2 | 1/2019 | Liu et al. | |
| 2006/0107249 A1* | 5/2006 | Zhang | G03F 7/70125 716/54 |
| 2006/0175556 A1* | 8/2006 | Yabuki | G21K 1/06 250/492.1 |
| 2010/0253926 A1 | 10/2010 | Endres et al. | |
| 2013/0194559 A1* | 8/2013 | Patra | G03F 7/70508 355/67 |
| 2014/0101622 A1 | 4/2014 | Blatchford | |
| 2015/0153652 A1 | 6/2015 | Zimmermann et al. | |
| 2015/0198891 A1* | 7/2015 | Patra | G03F 7/70116 359/849 |
| 2017/0010538 A1* | 1/2017 | Hansen | G03F 1/70 |
| 2019/0146353 A1 | 5/2019 | Winkler et al. | |
| 2021/0302844 A1 | 9/2021 | Van Oosten | |
| 2021/0405538 A1 | 12/2021 | Hansen | |
| 2022/0179325 A1 | 6/2022 | Hsu et al. | |

FOREIGN PATENT DOCUMENTS

| | | | | |
|---|---|---|---|---|
| WO | WO-2014042044 A1 * | 3/2014 | ......... | G03F 7/70091 |
| WO | 2020182440 A1 | 9/2020 | | |

OTHER PUBLICATIONS

English translation of WO2014/042044, published Mar. 20, 2014. (Year: 2014).*

Sekhar Mandal et al., "Binarization of degraded handwritten documents based on morphological contrast intensification", Proceedings of the 2015 Third International Conference on Image Information Processing (ICIIP), Dec. 21, 2015, pp. 73-78, DOI: 10.1109/ICIIP.2015.7414743, XP032869914.

Gabriel Scarmana, "A Contour-Based Approach to Image Compression", Proceedings of the 2011 International Conference on Digital Image Computing: Techniques and Applications (DICTA), Dec. 2011, pp. 186-190, DOI: 10.1109/DICTA.2011.38, XP032094757.

Communication issued on Nov. 13, 2023 by the European Patent Office for European Patent Application No. 23159617.2.

* cited by examiner

EXTREME ULTRAVIOLET LITHOGRAPHY DEVICE AND METHOD OF OPERATING EXTREME ULTRAVIOLET LITHOGRAPHY DEVICE

CROSS-REFERENCE TO RELATED APPLICATION(S)

This application is based on and claims priority to Korean Patent Application No. 10-2022-0068201 filed on Jun. 3, 2022 in the Korean Intellectual Property Office, the disclosure of which is incorporated herein by reference in its entirety.

BACKGROUND

One or more example embodiments relate to an extreme ultraviolet (EUV) lithography device, and a method of operating the EUV lithography device.

In general, as a line width of a semiconductor circuit is gradually reduced, a light source having a shorter wavelength is required. For example, EUV light may be used as a lithography light source. Due to the absorption properties of EUV light, a reflective EUV mask is generally used in an EUV lithography process. In addition, illumination optics for transmitting EUV light to an EUV mask and projection optics for projecting EUV light reflected from the EUV mask onto a lithography target may include a plurality of mirrors.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments provide an extreme ultraviolet (EUV) lithography device rendering a freeform EUV illumination system, and a method of operating the EUV lithography device.

Additional aspects will be set forth in part in the description which follows and, in part, will be apparent from the description, or may be learned by practice of the presented embodiments.

According to an aspect of an example embodiment, an operating method of an EUV lithography device may include defining a target image to render an illumination system, assigning priorities to respective positions of facets of a pupil facet mirror corresponding to the target image, assigning a mirror according to the assigned priorities using linear programming, generating the illumination system by selecting one of the facets of the pupil facet mirror based on a symmetry criterion, and converting mirror assignment information and source map information corresponding to the selected facet into a form recognizable by an EUV scanner.

According to an aspect of an example embodiment, an EUV lithography device may include an EUV light source, a first optical system configured to receive EUV light from the EUV light source and incident the EUV light on an EUV mask, a second optical system configured to receive the EUV light reflected from the EUV mask and incident the reflected EUV light on a wafer, a mask stage on which the EUV mask is provided, a wafer stage on which the wafer is provided, and a controller configured to control the mask stage and the wafer stage, where the first optical system includes a freeform illumination system, and the freeform illumination system is rendered by assigning, using linear programming, a field facet mirror to a pupil facet mirror to which a priority is assigned.

According to an aspect of an example embodiment, a computing device may include a memory device configured to store instructions, and at least one processor configured to execute the instructions to define a target image to be rendered, assign priorities to respective positions of facets of a pupil facet mirror corresponding to the target image, assign a mirror according to the assigned priorities using linear programming, generate an illumination system by selecting one of the facets of the pupil facet mirror based on a symmetry criterion, and convert mirror assignment information and source map information corresponding to the selected facet into a form recognizable by an EUV scanner.

According to an aspect of an example embodiment, an EUV lithography device may include an EUV light source, a field facet mirror configured to reflect light from the EUV light source, and a pupil facet mirror configured to receive light reflected from the field facet mirror and reflect the received light to a mask, where a priority is assigned to the pupil facet mirror based on a target image corresponding to a rendering of an illumination optical system and the field facet mirror is assigned as the pupil facet mirror to which the priority is assigned using linear programming.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Hereinafter, example embodiments will be described clearly and specifically such that a person skilled in the art could easily carry out example embodiments using the drawings. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

An extreme ultraviolet (EUV) lithography device and a method of operating the EUV lithography device according to an example embodiment may perform EUV illumination system rendering using linear programming and priority optimization. The EUV illumination system rendering may refer to an operation of assigning illumination rays reflected from a field facet mirror (FFM) to a suitable position of a pupil facet mirror (PFM). Through such a rendering process, an illumination system image generated through simulation or a drawing technique (diffraction optimization) may be converted into an implementable form for actual EUV lithography equipment. The generated illumination system image may be importantly used to determine EUV patterning performance (criteria dimension (CD) variation, dose, depth of focus (DoF), or the like). An EUV lithography device and a method of operating the EUV lithography device according to an example embodiment may generate an EUV illumination system optimized for user needs through linear programming and priority optimization.

Figure 1:
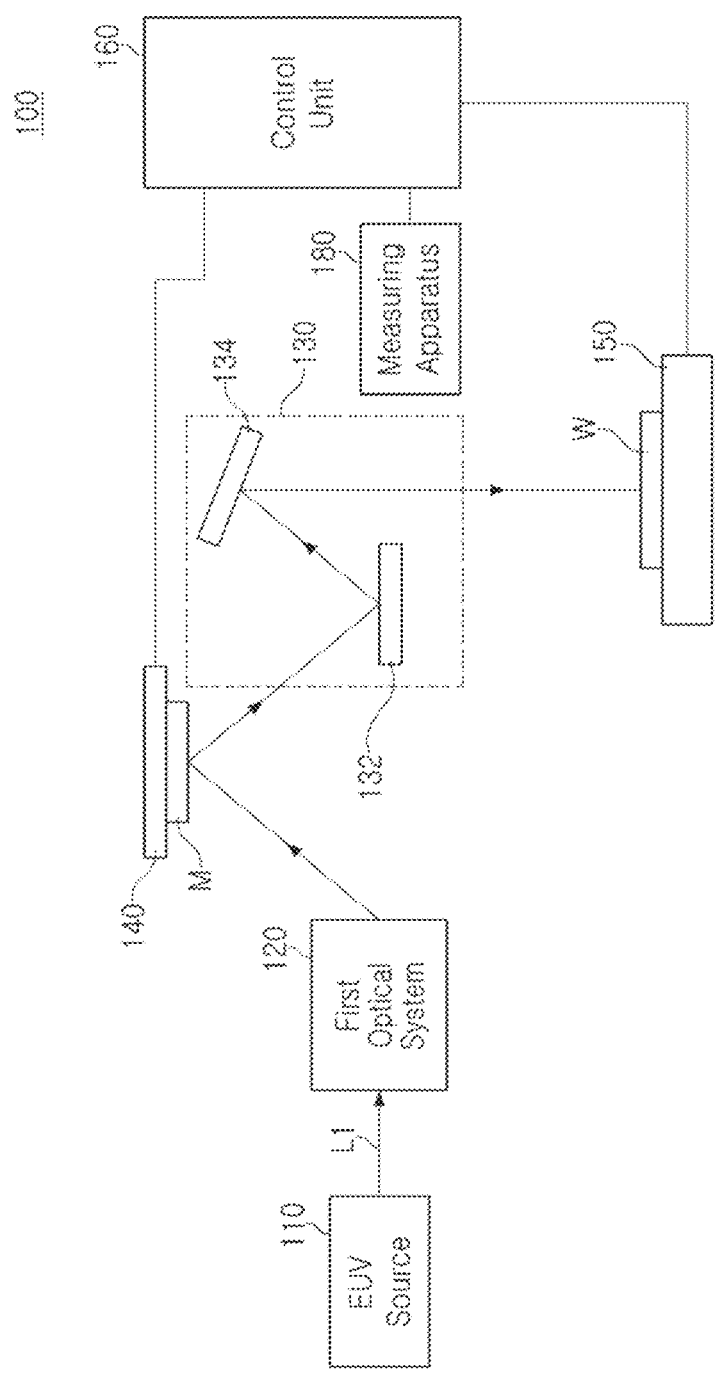
FIG. 1 is a diagram illustrating an extreme ultraviolet (EUV) lithography device according to an example embodiment.

FIG. 1 is a diagram illustrating an EUV lithography device 100 according to an example embodiment. Referring to FIG. 1, the EUV lithography device 100 may include an EUV light source 110, a first optical system 120, a second optical system 130, a mask stage 140, a wafer stage 150, a control unit 160, and a measuring apparatus 180.

The EUV light source 110 may be implemented to generate and output high energy density EUV light L1 within a wavelength range of about 5 nm to 50 nm. For example, the EUV light source 110 may generate and output the high energy density EUV light L1 having a wavelength of 13.5 nm. The EUV light source 110 may be a plasma-based light source or a synchrotron radiation light source. The plasma-based light source refers to a light source in a manner of generating plasma and using light emitted by the plasma. Such a light source may include a laser-produced plasma (LPP) light source, a discharge-produced plasma (DPP) light source, or the like. For example, the EUV light source 110 may be a plasma-based light source. It should be understood that the EUV light source 110 according to example embodiments is not limited to the plasma-based light source.

The plasma-based light source may include a condensing mirror such as an elliptical mirror or a spherical mirror for concentrating EUV light to increase the energy density of illumination light incident on the first optical system 120.

The first optical system 120 may be implemented to transmit the EUV light L1 from the EUV light source 110 to an EUV mask M. For example, the EUV light L1 from the EUV light source 110 may be incident on the EUV mask M arranged on the mask stage 140 through reflection by mirrors in the first optical system 120. The first optical system 120 may allow the EUV light L1 to be incident on the EUV mask M in the form of a curved slit. The curved slit form of EUV light may refer to a two-dimensional curve in the form of a parabola on an X-Y plane.

The first optical system 120 may include illumination optics. In an example embodiment, the first optical system 120 may include a plurality of mirrors. For example, the first optical system 120 may include two or three mirrors. It should be understood that the number of mirrors of the first optical system 120 is not limited to two or three. The first optical system 120 may include a FFM and a PFM.

In addition, the first optical system 120 may be implemented as a freeform optical system. The first optical system 120 may be optimized through linear programming and priority optimization.

The EUV mask M may be a reflective mask having a reflection region and a non-reflection or intermediate reflection region. The EUV mask M may include a reflection multilayer film for reflecting EUV on a substrate formed of a low thermal expansion coefficient material (LTEM) such as quartz and an absorption layer pattern formed on the reflection multilayer film. Here, the reflection multilayer film may have a structure in which, for example, a molybdenum film (Mo layer) and a silicon film (Si layer) are alternately stacked in an amount of more than tens of layers. In addition, the absorption layer may be formed of, for example, TaN, TaNO, TaBO, Ni, Au, Ag, C, Te, Pt, Pd, Cr, or the like. It should be understood that the material of the reflection multilayer film and the material of the absorption layer are not limited to the above-mentioned materials. An absorbing layer portion may correspond to a non-reflection or intermediate reflection region.

The EUV mask M may reflect the EUV light L1 incident through the first optical system 120 to allow the EUV light L1 to be incident on the second optical system 130. Specifically, the EUV mask M may reflect EUV light from the first optical system 120, and structuralize the EUV light according to a form of a pattern including the reflection multilayer film and the absorption layer on the substrate, thereby allowing the EUV light to be incident on the second optical system 130. The EUV light may be structuralized to include second-order diffracted light, based on a pattern on the EUV mask M. The structuralized EUV light may be incident on the second optical system 130 while retaining information on a form of the pattern on the EUV mask M, and may be transmitted through the second optical system 130 to be projected onto an EUV lithography target W such that an image corresponding to the pattern form is formed. The EUV lithography target W may be a substrate including a semiconductor material such as silicon, for example, a wafer.

The second optical system 130 may be implemented to transmit the EUV light reflected from the EUV mask M to the EUV lithography target W through reflection by mirrors. In addition, the second optical system 130 may be implemented such that EUV light is incident on an upper surface of the EUV lithography target W with a predetermined inclination. For example, in the second optical system 130, the EUV light may be incident on the upper surface of the EUV lithography target W at an incident angle of about 6°.

The second optical system 130 may include projection optics. The second optical system 130 may include a plurality of mirrors. The second optical system 130 illustrated in FIG. 1 may include two mirrors, that is, a first mirror 132 and a second mirror 134. However, the second optical system 130 may include more mirrors. For example, the second optical system 130 may include four to eight mirrors. It should be understood that the number of mirrors of the second optical system 130 is not limited thereto.

The EUV mask M may be arranged on the mask stage 140. The mask stage 140 may move in an X-direction and a Y-direction on the X-Y plane, and may move in a Z-direction, perpendicular to the X-Y plane. In addition, the mask stage 140 may rotate on the X-Y plane with respect to a Z-axis, or may rotate on a Y-Z plane or an X-Z plane with respect to any one axis on the X-Y plane, for example, an X-axis or a Y-axis. By the movement of the mask stage 140, the EUV mask M may move in the X-direction, Y-direction, or Z-direction, and may also rotate with respect to the X-axis, Y-axis, or Z-axis.

The EUV lithography target W, for example, a wafer may be arranged on the wafer stage 150. The wafer stage 150 may move in the X-direction and the Y-direction on the X-Y plane, and may move in the Z-direction, perpendicular to the X-Y plane. In addition, the wafer stage 150 may rotate on the X-Y plane with respect to the Z-axis or rotate on the Y-Z plane or the X-Z plane with respect to any one axis on the X-Y plane, for example, the X-axis or the Y-axis. By the movement of the wafer stage 150, the EUV lithography target W may move in the X-direction, Y-direction, or Z-direction, and may also rotate with respect to the X-axis, Y-axis, or Z-axis.

The control unit 160 may be implemented to control the mask stage 140 and the wafer stage 150.

The measuring apparatus 180 may be implemented to measure a CD or an overlay error for patterns on a wafer. The measuring apparatus 180 may include an optical microscope or an electron microscope such as a scanning electron microscope (SEM) or a transmission electron microscope (TEM). In addition, the measuring apparatus 180 may use an ellipsometry such as an imaging ellipsometry (IE) or a spectroscopic imaging ellipsometry (SIE) as a measurement method. It should be understood that the measurement method of the measuring apparatus 180 is not limited thereto. In FIG. 1, the EUV lithography device 100 may include the measuring apparatus 180. However, this is an example embodiment, and the measuring apparatus 180 may be implemented as a device separate from the EUV lithography device 100. The measurement of the CD or overlay error for the patterns on the wafer through the measuring apparatus 180 may be performed as an after development inspection (ADI) and an after cleaning inspection (ACI).

According to an example embodiment, the EUV lithography device 100 may significantly improve patterning performance by rendering the EUV illumination system using linear programming and priority optimization. Accordingly, a semiconductor chip using the EUV lithography device 100 according to an example embodiment may have improved production yield and improved quality.

Figure 2:
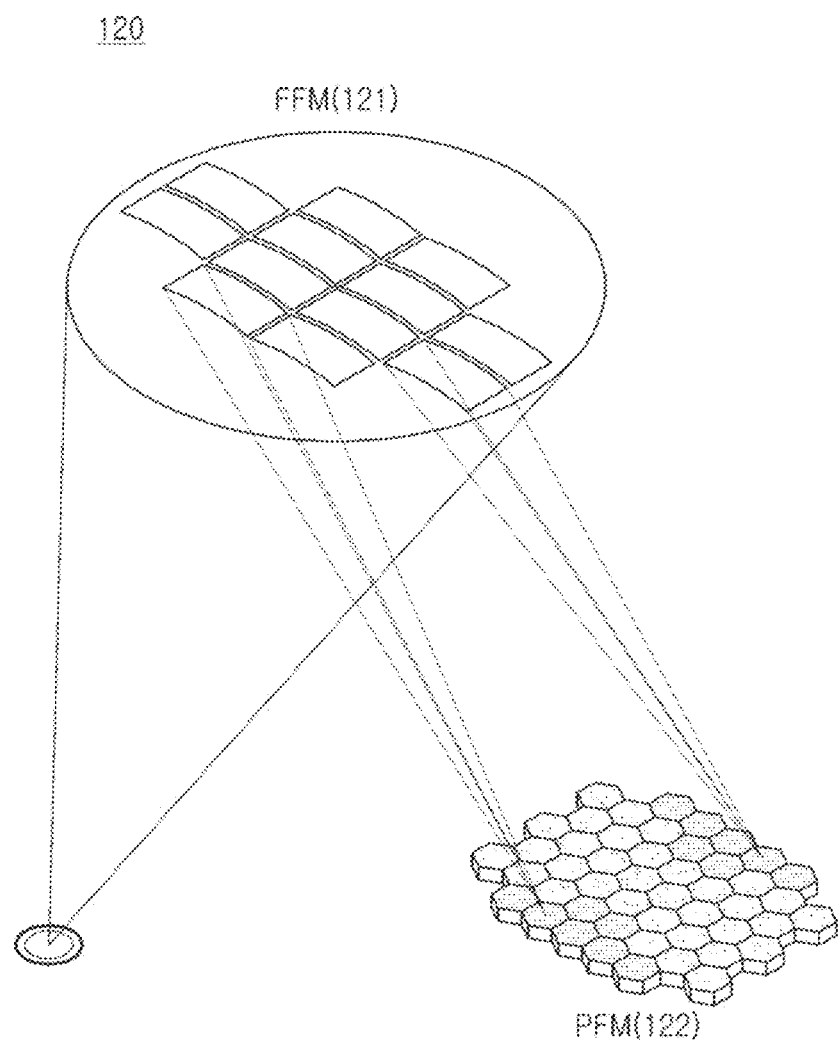
FIG. 2 is a diagram illustrating a first optical system of an EUV lithography device according to an example embodiment.

FIG. 2 is a diagram illustrating the first optical system 120 of the EUV lithography device 100 according to an example embodiment. Referring to FIG. 2, the first optical system 120 may include an FFM 121 and a PFM 122 forming an illumination system rendering.

In general, a limitation to performance of EUV illumination system rendering may come from a hardware limitation in which each FFM is able to only deliver light to a limited number of PFMs. For example, an EUV scanner may be implemented to include an FFM of a total of 336 field facets and a PFM of 1620 pupil facets. It should be understood that the number of FFMs and the number of PFMs are not limited thereto.

Each field facet may transmit light to unique PFM positions including a finite number of pupil facets referred to as an illumination channel group. For example, illumination channel groups in an NXE:3400C EUV scanner implemented to have 336 field facets and 1620 pupil facets may be implemented to have four or five unique PFM positions. It should be understood that the number of PFM positions implementing the illumination channel group is not limited thereto. Such a hardware limitation inevitably may result in a PFM position that cannot be filled when a desired illumination system target of a user includes two or more PFM positions belonging to the same illumination channel group, which may make perfect lighting system rendering impossible. Such an issue may be exacerbated when using 100% illuminator efficiency. When rendering an illumination system having a complex shape or an illumination system requiring the use of an area that is difficult to render due to the nature of hardware, rendering performance may be degraded rapidly. In general, the illumination may be a key factor for determining the overall performance of EUV lithography equipment.

The first optical system 120 according to an example embodiment may include an EUV freeform illumination system optimized for user needs by assigning a mirror using a rendering algorithm that performs linear programming and priority optimization.

Figure 3:
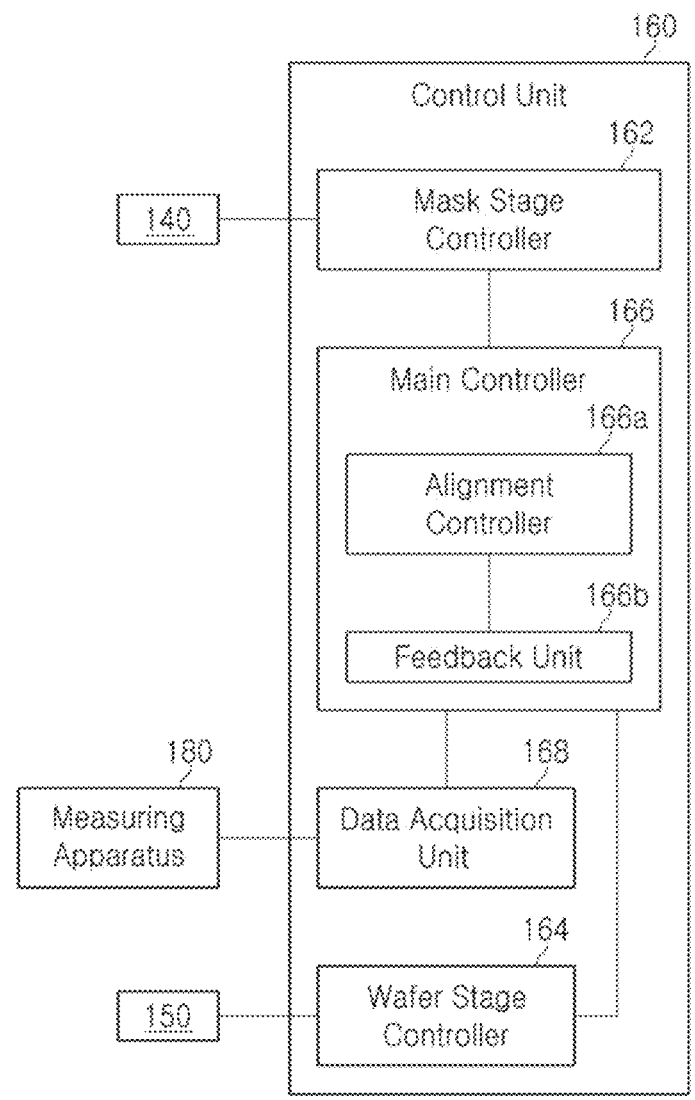
FIG. 3 is a diagram illustrating a control unit of an EUV lithography device according to an example embodiment.

FIG. 3 is a diagram illustrating the control unit 160 of the EUV lithography device 100 according to an example embodiment. Referring to FIG. 3, the control unit 160 may include a mask stage controller 162, a wafer stage controller 164, a main controller 166, and a data acquisition unit 168. The mask stage controller 162 may control movement of the mask stage 140. The movement of the mask stage 140 may include movement in an X-direction, Y-direction, or Z-direction and rotation with respect to an X-axis, Y-axis, or Z-axis.

The wafer stage controller 164 may control movement of the wafer stage 150. The movement of the wafer stage 150 may also include movement in the X-direction, Y-direction, or Z-direction and rotation about the X-axis, Y-axis, or Z-axis.

The main controller 166 may include an alignment controller 166a and a feedback unit 166b. The alignment controller 166a may calculate a correction value of parameters of an overlay error. The correction value of the parameters of the overlay error may be calculated based on data on the parameters of the overlay error and a correlation between the parameters of the overlay error. The parameters of the overlay error may refer to parameters related to an overlay error between layers on the EUV lithography target W, for example, a wafer. The overlay error may refer to an overlap difference between an underlayer and a current layer corresponding to an upper layer. In general, during a lithography process of the upper layer, an overlay error may be minimized by taking a shot according to the underlayer as much as possible based on an overlay mark of the underlayer. When the overlay error is large (that is, when there is a large relative position difference between the underlayer and the current layer), the performance of a semiconductor device may be adversely affected.

The alignment controller 166a may calculate, based on a correlation between a first overlay parameter and a second overlay parameter, a correction value of the second overlay parameter from data on the first overlay parameter. The first overlay parameter may be an RK13 parameter among overlay parameters, and the second overlay parameter may be a RK12 parameter among the overlay parameters.

The feedback unit 166b may feed the calculated correction values of the overlay parameters back to the mask stage controller 162 or the wafer stage controller 164. The mask stage controller 162 or the wafer stage controller 164 may control, based on the correction values of the overlay parameters, movement of the mask stage 140 or the wafer stage 150. As a specific example, the feedback unit 166b may feed the calculated correction value of the second overlay parameter (e.g., the RK12 parameter) back to the mask stage controller 162, and the mask stage controller 162 may control, based on the correction value of the second overlay parameter, rotation of the mask stage 140 with respect to the X-axis.

The main controller 166 may collectively control the mask stage controller 162 and the wafer stage controller 164. For example, the main controller 166 may control the mask stage controller 162 and the wafer stage controller 164 to synchronize the mask stage 140 and the wafer stage 150 in a scanning direction during a lithography process.

The main controller 166 may further include various components for control in an EUV lithography process. For example, the main controller 166 may include a focus controller, a data storage unit, a lithography processor, and the like. The focus controller may compare a measured focus offset with a required focus offset to obtain a focus correction value, and transmit the focus correction value to the wafer stage controller 164 through the feedback unit 166b, such that the wafer stage controller 164 may control the movement of the wafer stage 150 in the Z-direction or the like. The data storage unit may store data on the correction values of overlay parameters, the correlation between the overlay parameters, and the focus correction value obtained through the alignment controller 166a or the focus controller. After the movement of the mask stage 140 and the wafer stage 150 is controlled through the alignment controller 166a or the focus controller, the lithography processor may perform a lithography process while synchronizing the mask stage 140 and the wafer stage 150 in a scanning direction through the main controller 166.

When the measuring apparatus 180 is included in the EUV lithography device 100, the main controller 166 may further include a measurement controller. The measurement controller may control the measuring apparatus 180 to measure data related to required overlay parameters.

The data acquisition unit 168 may acquire data on the overlay parameters through the measuring apparatus 180 and transmit the data to the main controller 166. Specifically, the measuring apparatus 180 may measure an overlay error with respect to patterns on a wafer, and the data acquisition unit 168 may receive data on the overlay error from the measurement apparatus 180. As a result, the data acquisition unit 168 may acquire the data on the overlay parameters required from the measuring apparatus 180 and transmit the data to the main controller 166.

In an example embodiment, the data acquisition unit 168 may acquire data on the first overlay parameter (e.g., the RK13 parameter), through the measuring apparatus 180, and may transmit the data to the alignment controller 166a of the main controller 166. Data on an overlay parameter acquired by the data acquisition unit 168 is not limited to the data on the RK13 parameter.

The EUV lithography device 100 may correct the first overlay parameter that is in a correlation by correcting the second overlay parameter, thereby significantly improving an overlay error in the EUV lithography process. The first overlay parameter may correspond to the K13 parameter, and the second overlay parameter may correspond to the K12 parameter. The K13 parameter may correspond to an overlay parameter that is not correctable through physical actuation of the EUV lithography device 100. The physical actuation may refer to a physical operation in a scanner (e.g., a lithography device) to correct an overlay error. For example, the physical actuation may include various methods such as a method of applying pressure or tilt to a lens or mirror in an optical system, or of quickly moving the lens or mirror, a method of moving a mask through the mask stage 140 or moving the EUV lithography target W through the wafer stage 150, a method of heating the EUV lithography target W, and the like.

When the overlay parameters relate to physical actuation on a reticle (e.g., a mask), a word R may be added to a symbol of a parameter. For example, when the K12 parameter and the K13 parameter relate to the physical actuation on the mask, the K12 parameter and the K13 parameter may be referred to as an RK12 parameter and an RK13 parameter. The overlay parameters may be distinguished from each other in various manners. In particular, some of the overlay parameters may not be corrected due to a hardware limitation of an EUV scanner or EUV lithography device. For example, among the overlay parameters, the RK13 parameter may refer to an overlay distortion having a shape of a cubic function in the X-direction, perpendicular to the scanning direction. The RK13 parameter may be corrected through physical actuation in an ArFi scanner according to the related art. However, in the case of an EUV scanner having a hardware structure different from that of the ArFi scanner, the K13 parameter may not be corrected through physical actuation, due to a control limitation. Accordingly, in the EUV lithography process, the RK13 parameter among the overlay parameters may be classified as a parameter that is not correctable.

The EUV lithography device 100 according to an example embodiment may use an illumination system generated closer to an illumination system desired by a user through improvement in EUV illumination system rendering performance, thereby improving patterning performance of EUV equipment.

Figure 4:
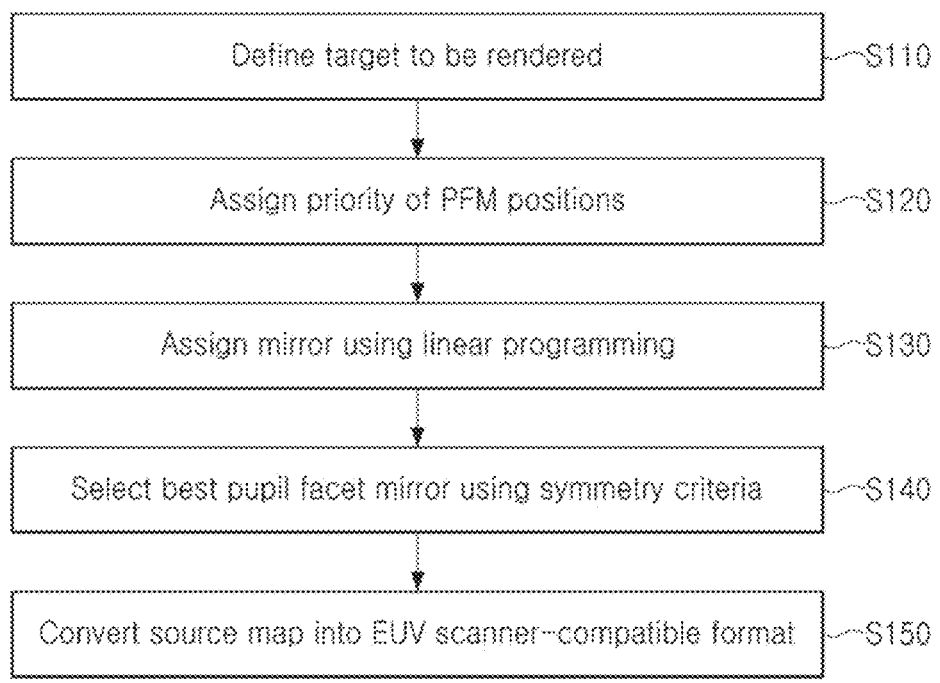
FIG. 4 is a flowchart illustrating a method of operating an EUV lithography device according to an example embodiment.

FIG. 4 is a flowchart illustrating a method of operating the EUV lithography device 100 according to an example embodiment. Referring to FIG. 4, the EUV lithography device 100 may operate as follows.

In operation S110, the EUV lithography device 100 may define a target to be rendered. An ideal EUV illumination system most suitable for user needs may be defined as the target. The target may be acquired by source mask optimization (SMO), illumination system simulation (e.g., a normalized log image slope (NILS) map or the like), or a drawing technique. A corresponding target may be acquired as an image file or may have an abstractly desired shape.

In operation S120, the EUV lithography device 100 may assign a priority (e.g., an order of priority) of PFM positions. In operation S130, the EUV lithography device 100 may assign a mirror (e.g., an FFM) corresponding to each of the PFM positions using linear programming. In operation S140, the EUV lithography device 100 may select an optimal PFM using a symmetry criterion. In operation S150, the EUV lithography device 100 may convert source map information and mirror assignment information corresponding to the selected PFM into a format suitable for an EUV scanner.

In an example embodiment, a target image may be acquired through a drawing technique or SMO. In an example embodiment, a subdivided priority may be determined by processing the target image. In an example embodiment, a cost matrix may be generated according to the priority. In an example embodiment, a basic cost matrix may be updated by generating the basic cost matrix according to illumination channel group information and determining a value for each position of a PFM according to the priority. In an example embodiment, a total cost may be optimized using a Hungarian algorithm, and a FFM corresponding to the optimized total cost may be searched. In an example embodiment, when there is one mirror arrangement combination having the optimized total cost, source map information and mirror assignment information may be directly converted into a form suitable for an EUV scanner without selecting one of facets of the PFM. In an example embodiment, when there is a plurality of mirror arrangement combinations having the optimized total cost, a plurality of mirror arrangement diagrams may be generated by randomizing and sampling a PFM order of the cost matrix, and one of the plurality of mirror arrangement diagrams may be selected as an optimal illumination system using a symmetry criterion.

Figure 5:
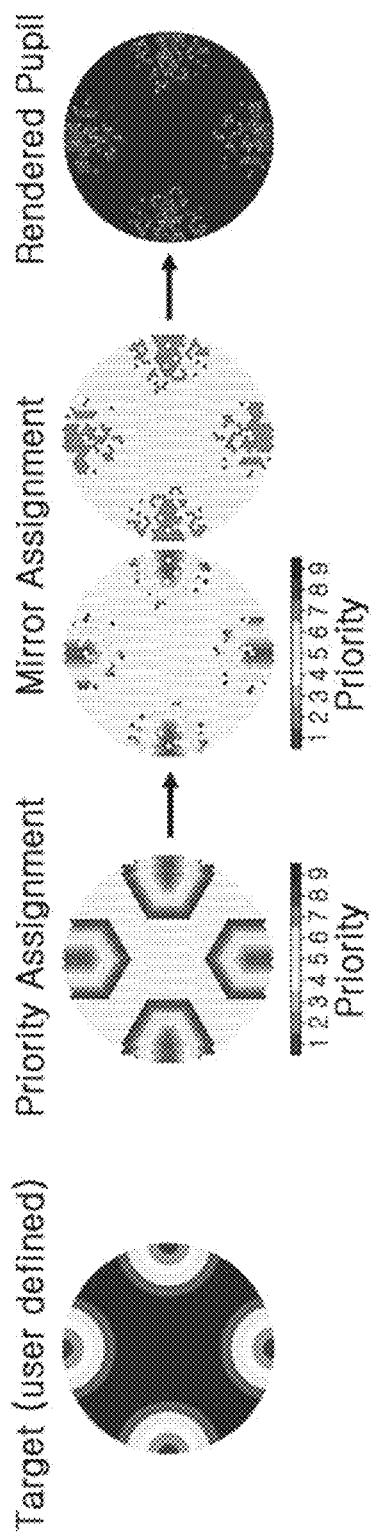
FIG. 5 is a diagram illustrating an EUV illumination system rendering process according to a drawing technique, according to an example embodiment.

FIG. 5 is a diagram illustrating an EUV illumination system rendering process according to a drawing technique, according to an example embodiment. A target may be defined by a user. With reference to the target, a priority of all PFM positions may be assigned. As illustrated in FIG. 5, when a target is generated by the drawing technique, an image file may be first generated, and then may be converted into PFM coordinates (for example, PFM coordinates acquired through a reverse process of analyzing illumination systems generated through Tachyon software developed by ASML Brion, a subsidiary of ASML, an EUV scanner facility). In this case, the converted PFM coordinates may be used as an input for priority assignment.

Thereafter, a cost matrix may be generated according to the priority. A FFM may be assigned using the cost matrix and linear programming. The linear programming may use a Hungarian algorithm. In general, the Hungarian algorithm may be an algorithm finding maximum weight matching in a weighted graph.

When there is only one mirror arrangement combination having an optimized total cost value, a pupil faceted mirror may be rendered immediately. Conversely, when there are a plurality of mirrors having the same total cost value, an optimal PFM to be rendered may be selected using a symmetry criterion. The symmetry criterion may refer to vertical and horizontal symmetry, vertical or horizontal symmetry, n-fold symmetry, inversion symmetry, symmetry with respect to a specific line, and the like of a mirror arrangement diagram according to target properties. According to a finally selected mirror arrangement, a final source map reflecting unique intensity values (e.g., equipment hardware inputs acquired through a reverse process) of respective PFMs may be generated. In addition, an illumination system file may be generated in a suitable format (for example, xml format) such that mirror assignment information and source map information are loaded into an EUV scanner.

Figure 6:
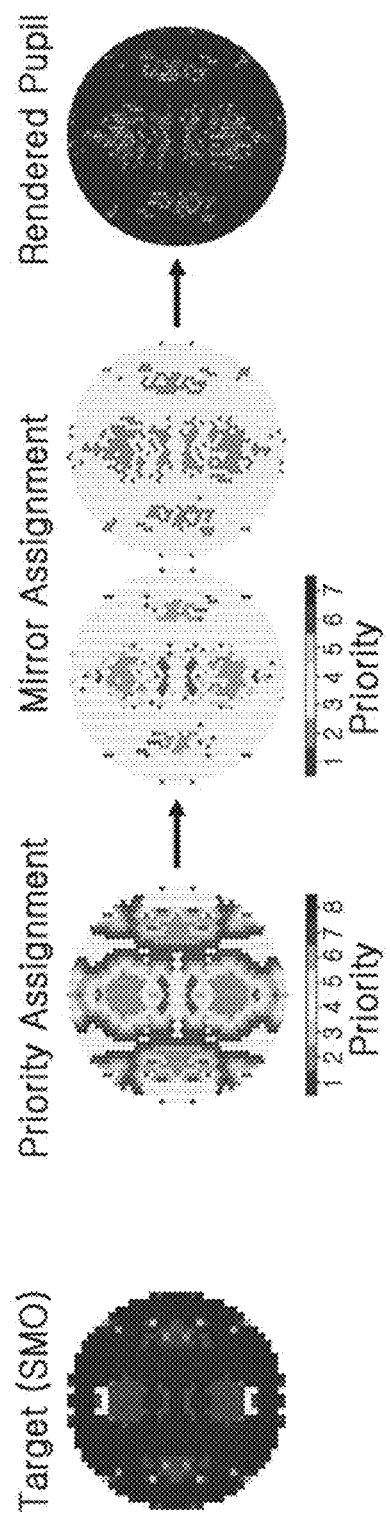
FIG. 6 is a diagram illustrating a process of rendering an EUV illumination system according to source mask optimization (SMO) according to an example embodiment.

FIG. 6 is a diagram illustrating a process of rendering an EUV illumination system according to SMO according to an example embodiment. As illustrated in FIG. 6, a target may be acquired in SMO. An SMO output image generated by Tachyon software may be converted into PFM coordinates, such that a SMO target may be used as an input for priority assignment. In an example embodiment, such a target image may be used as a priority assignment input as is. In another example embodiment, image processing (masking, dilation, erosion, closing, and the like) may be applied to a target input to maximize performance of assigning a priority in units of PFMs, such that a further subdivided priority may be determined. Such subdivided optimal priority assignment may be acquired by using a user's knowledge or experience or through high-resolution illumination system simulation.

Thereafter, a cost matrix may be generated according to a defined priority. FFMs may be assigned using the cost matrix and linear programming. Thereafter, an optimal PFM to be rendered may be selected from among the assigned FFMs. In a similar manner to a drawing technique, a final source map (e.g., the rendered pupil) reflecting unique intensity values of respective PFMs may be generated according to a finally selected mirror arrangement. In addition, mirror assignment information and source map information may be converted into a suitable format such that the mirror assignment information and the source map information are uploaded to an EUV scanner.

Figure 7:
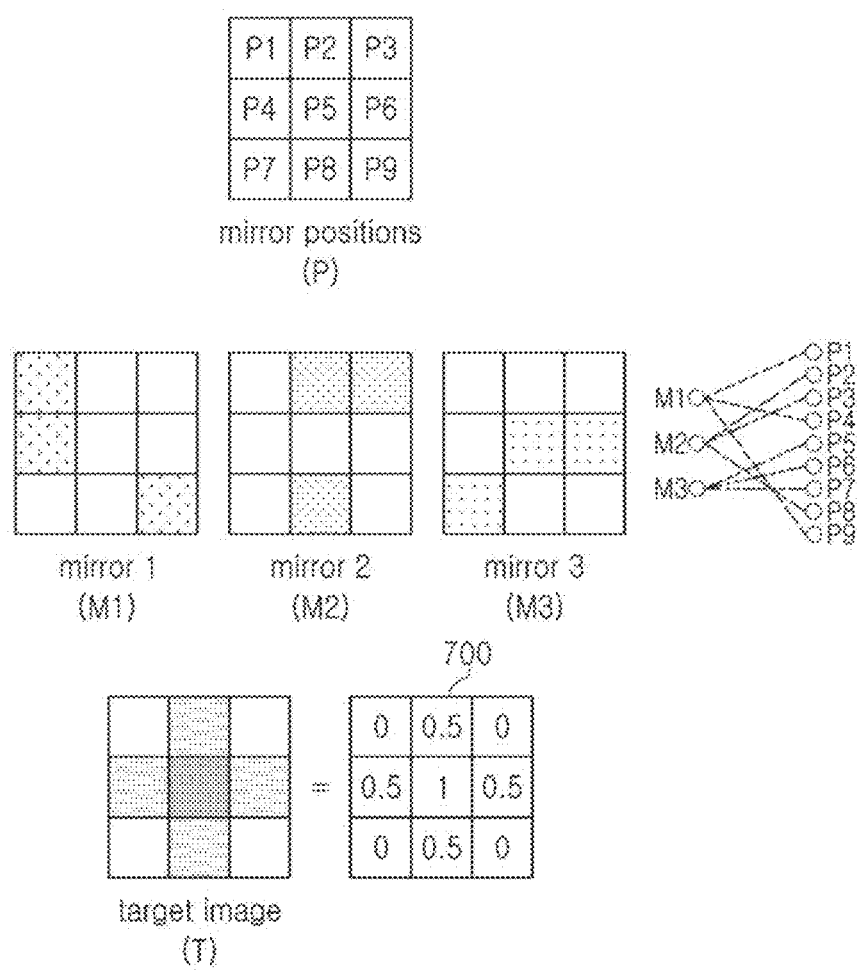
FIG. 7 is a diagram illustrating setting a simple example embodiment of linear programming according to an example embodiment.

FIG. 7 is a diagram illustrating setting a simple example embodiment of linear programming according to an example embodiment. For ease of description, it is assumed that field facets may be assigned to three unique PFM positions, respectively. A basic cost matrix 700 may be generated according to illumination channel group information acquired through a reverse process. The cost matrix 700 may be updated by assigning a value to each PFM position according to a defined priority. Thereafter, a total cost may be optimized using a Hungarian algorithm, an algorithm derived from the Hungarian algorithm, or another linear programming algorithm developed for the purpose of cost optimization. A process of finding mirrors corresponding to the optimized total cost may be mirror assignment. The total cost may indicate how close to a desired target.

Figure 8:
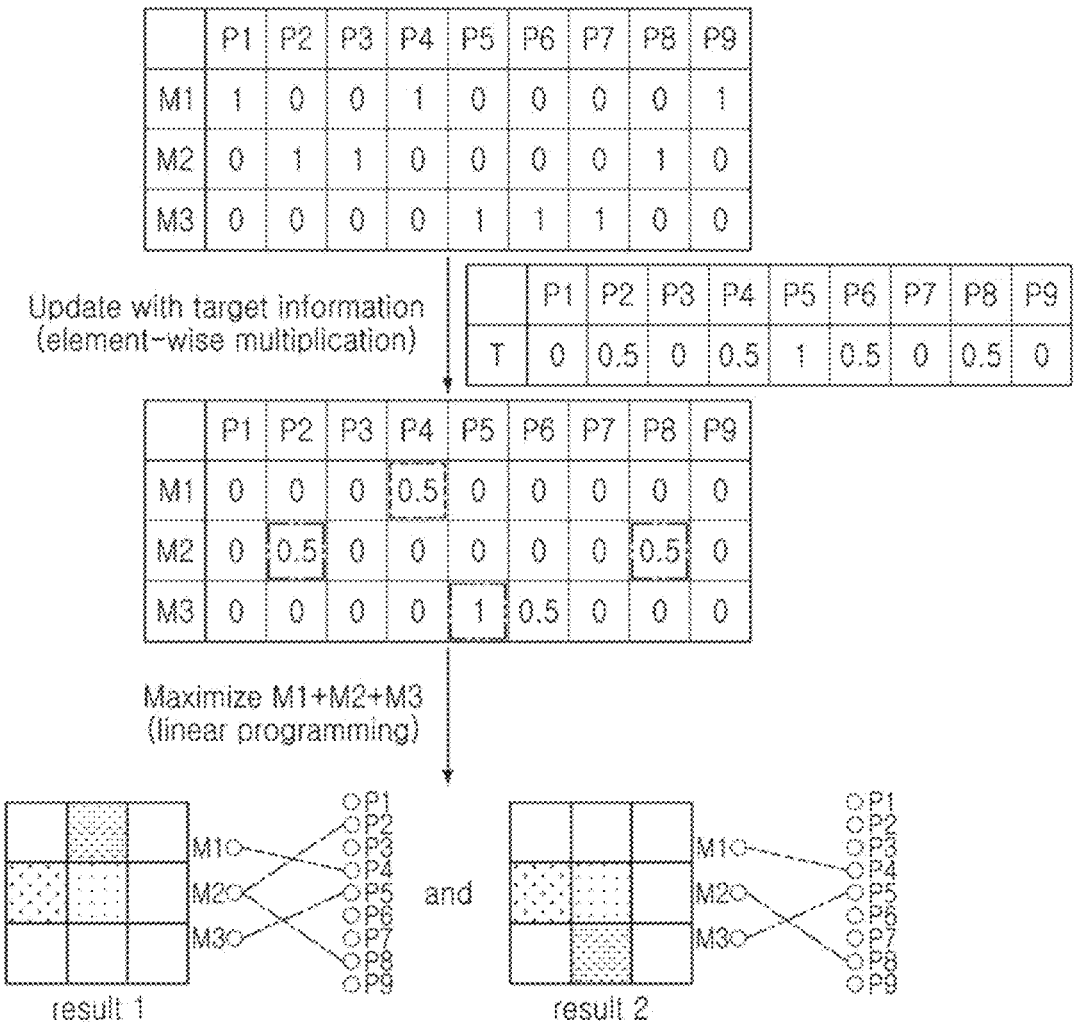
FIG. 8 is a diagram illustrating a process of selecting an optimal illumination system according to an example embodiment.

FIG. 8 is a diagram illustrating a process of selecting an optimal illumination system according to an example embodiment. Referring to FIG. 8, the process of selecting an optimal illumination system may be performed as follows.

When there is only one mirror arrangement combination having an optimized total cost value, image file conversion may be performed immediately. However, as illustrated in FIG. 8, a first result (result 1) and a second result (result 2) may have the same total cost value. Thus, an additional criterion may be applied to select a final illumination system. For example, when there are a plurality of mirror arrangement combinations having the same total cost value, a PFM order of a cost matrix may be randomized. Thereafter, a plurality of mirror arrangement diagrams may be generated by sampling. Thereafter, an optimal illumination system may be selected by applying a symmetry criterion. The symmetry criterion may refer to vertical and horizontal symmetry, vertical or horizontal symmetry, n-fold symmetry, inversion symmetry, symmetry with respect to a specific line, and the like of a mirror arrangement diagram according to target properties. Facets of a mirror may be treated as individual points to be used as criteria such as a degree of a central portion of an overall pattern being moved from a central portion of a PFM module, a degree of a position of the central portion being moved when the pattern is vertically or horizontally inverted, and the like. The reason for selecting the optimal illumination system for symmetry may be that complete asymmetry of an illumination system may generally lead to a poor result (for example, CD skew) in an actual wafer. However, even when various symmetry criteria are satisfied, the performance may not necessarily improve proportionally, and symmetry suitable for the target properties may be important.

Figure 9:
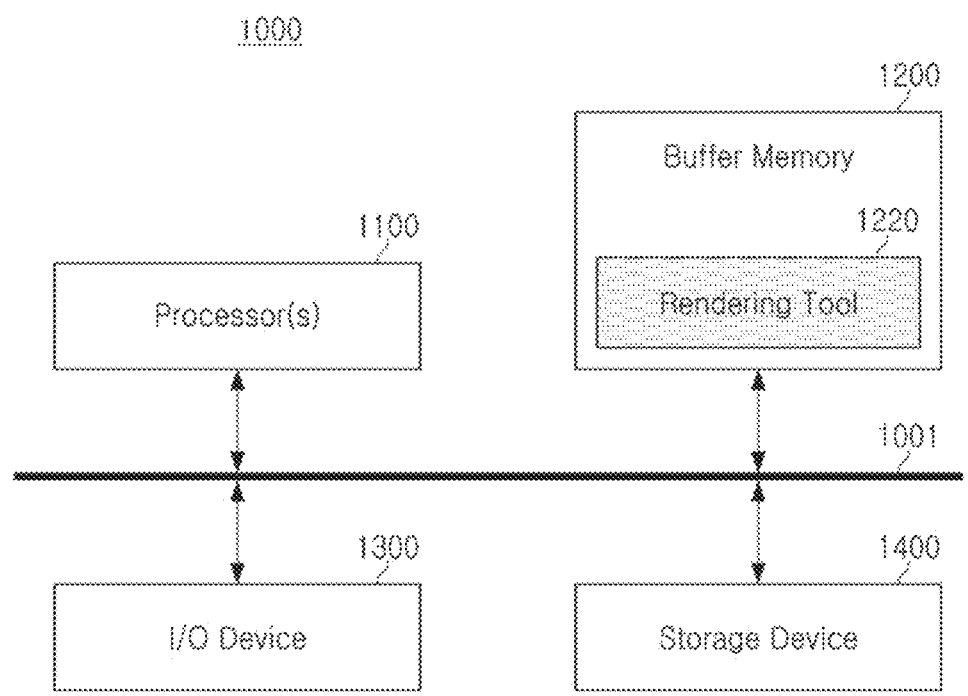
FIG. 9 is a diagram illustrating a computing device performing EUV illumination system rendering according to an example embodiment.

FIG. 9 is a diagram illustrating a computing device 1000 performing EUV illumination system rendering according to an example embodiment. Referring to FIG. 9, the computing device 1000 may include at least one processor 1100 connected to a system bus 1001, a memory device 1200, an input/output (I/O) device 1300, and a storage device 1400.

The processor 1100, the memory device 1200, the I/O device 1300, and the storage device 1400 may be electrically connected to each other and exchange data with each other, through the system bus 1001. A configuration of the system bus 1001 is not limited to the above description, and may further include mediation measures for efficient management.

At least one processor 1100 may be implemented to control an overall operation of the computing device 1000. The processor 1100 may be implemented to execute at least one instruction. For example, the processor 1100 may be implemented to execute software (e.g., an application program, an operating system, device drivers, etc.) to be performed on the computing device 1000. The processor 1100 may execute an operating system loaded into the memory device 1200. The processor 1100 may execute various application programs to be driven based on the operating system. For example, the processor 1100 may drive a rendering tool 1220 read from the memory device 1200. In an example embodiment, the processor 1100 may be a central processing unit (CPU), a microprocessor, an application processor (AP), or any processing device similar thereto.

The memory device 1200 may be implemented to store at least one instruction. For example, the memory device 1200 may be loaded with the operating system or application programs. When the computing device 1000 is booted, an operation system (OS) image stored in the storage device 1400 may be loaded into the memory device 1200 based on a booting sequence. All input/output operations of the computing device 1000 may be supported by the operating system. Similarly, the application programs may be loaded into the memory device 1200 to be selected by a user or to provide a basic service. In particular, the rendering tool 1220 performing EUV illumination system rendering may be loaded from the storage device 1400 into the memory device 1200.

In addition, the memory device 1200 may be a volatile memory such as a dynamic random access memory (DRAM) or a static random access memory (SRAM), or a nonvolatile memory such as a flash memory, a phase change random access memory (PRAM), a resistance random access memory (RRAM), a nano floating gate memory (NFGM), a polymer random access memory (PoRAM), a magnetic random access memory (MRAM), or a ferroelectric random access memory (FRAM).

The rendering tool 1220 may form a freeform optical system through linear programming and priority optimization. The rendering tool 1220 may be executed by the processor 1100 to define a target image to be rendered, assign a priority to positions of facets of a PFM corresponding to the target image, select one of the facets of the PFM using a symmetry criterion to generate an illumination system, and convert mirror assignment information and source map information corresponding to the selected PFM into a form suitable for an EUV scanner.

In an example embodiment, the rendering tool 1220 may image-process the target image to assign a subdivided priority. The subdivided priority may be determined using high-resolution NILS map simulation. In an example embodiment, the rendering tool 1220 may assign the PFM by generating contour lines at an equal interval with respect to a target region. In an example embodiment, after a plurality of mirror arrangement diagrams are generated, the rendering tool 1220 may select an optimal illumination system from among the plurality of mirror arrangement diagrams using the symmetry criterion.

In addition, the rendering tool 1220 may be included in an electronic design automation (EDA) commercial tool. The EDA commercial tool may include a design tool. The design tool may perform a function of changing shapes and positions of specific layout patterns differently from those defined by a design rule. In addition, the design tool may perform a design rule check (DRC) under a changed bias data condition.

The I/O device 1300 may be implemented to control an input and an output of a user from a user interface device. For example, the I/O device 1300 may include input measures such as a keyboard, a keypad, a mouse, and a touch-screen to receive information from a designer. The designer may receive, using the I/O device 1300, information on a semiconductor region or data paths requiring adjusted operation properties. In addition, the I/O device 1300 may include an output measure such as a printer or a display to display a processing procedure and a processing result of the rendering tool 1220.

The storage device 1400 may be provided as a storage medium of the computing device 1000. The storage device 1400 may store application programs, an OS image, and various pieces of data. The storage device 1400 may be provided in the form of a mass storage device such as a memory card (MultiMediaCard (MMC), eMMC, secure digital (SD), Micro SD, or the like), a hard disk drive (HDD), a solid state drive (SSD), a universal flash storage (UFS), or the like.

A semiconductor chip may be manufactured as follows using the above-described EUV lithography device and EUV optical system rendering thereof. A design layout corresponding to a circuit pattern of a semiconductor chip to be formed on a wafer may be provided from a host computer or server of semiconductor manufacturing equipment. Specifically, the layout, a physical indication that a circuit designed for a semiconductor chip may be transferred onto a wafer, may include a plurality of patterns. For example, the design layout may be provided as coordinate values of contours of patterns forming the design layout from a computer aided design (CAD) system. In particular, the patterns may include repeating patterns in which the same shape is repeated. Here, the patterns may be provided to have a shape of a combination of polygons, such as a triangle or a square.

Thereafter, process proximity correction (PPC) using machine learning may be performed on the design layout. In an example embodiment, the PPC may be performed based on a rule. In another example embodiment, the PPC may be performed based on a model. In another example embodiment, PPC rule check (PRC) using machine learning may be performed. In an example embodiment, an ACI CD may be predicted using machine learning. Thereafter, optical proximity correction (OPC) may be performed on the design layout. The OPC refers to correction of changing patterns included in a design layout by reflecting an error caused by an optical proximity effect (OPE). In general, an OPC method may be divided into a rule-based OPC method and a model-based OPC method.

Thereafter, a contour of a target pattern may be predicted through simulation by inputting mask data into an OPC model. After an OPC operation, an OPC verification operation may be further performed. Thereafter, position correction may be additionally performed. The position correction may be moving only a position without changing a shape of a pattern on which OPC is performed. Final design layout data corrected by OPC and position correction may be transmitted to lithography equipment for manufacturing a mask for a lithographic process, such as a photomask and an electron beam mask. A mask may be manufactured using the corrected design layout. For example, after OPC is performed, design data obtained through OPC may be transmitted as mask tape out (MTO) design data. The MTO design data may be mask design data in which OPC is completed.

The MTO design data may have a graphic data format used in electronic design automation (EDA) software or the like. For example, the MTO design data may have a data format such as GDS, OASIS, or the like. After the MTO design data is transmitted, mask data preparation (MDP) may be performed. The MDP may include format conversion, augmentation, and verification. Such a format conversion may also be referred to as fracturing, and refers to a process of fracturing the MTO design data for each region and changing the fractured MTO design data into a format for an electron beam lithography device. For example, fracturing may include data manipulation such as scaling, data sizing, data rotation, pattern reflection, color inversion, or the like. In a format conversion process, data on systematic errors during a process of being transmitted from design data to an image on a wafer may be corrected.

A lithography process may be performed on a mask substrate using the corrected design layout data. After the lithography process, for example, a mask may be formed by further performing a series of processes such as development, etching, cleaning, and baking. In an example embodiment, before the corrected design layout data is transmitted, a verification operation for the corrected design layout data may be further performed.

Thereafter, a semiconductor chip may be manufactured using a mask. The semiconductor chip may include a volatile memory such as a DRAM, an SRAM, or the like, or a nonvolatile memory such as a flash memory. A logic semiconductor device such as a micro-processor may include, for example, a CPU, a controller, or an application specific integrated circuit (ASIC). The semiconductor chip may be finally manufactured by further performing, in addition to the lithography process, a deposition process, an etching process, an ion process, a cleaning process, or the like.

An EUV lithography device and a method of the EUV lithography device according to an example embodiment may use linear programming including a Hungarian algorithm for illumination system rendering. In an example embodiment, subdivided priority assignment may be used in individual PFM units. In an example embodiment, a drawing technique or illumination system simulation (SMO, NILS map simulation, or the like) may be used. In an example embodiment, a high-resolution NILS map simulation using a method of sweeping through a point source may be used. In an example embodiment, image processing (masking, dilation, erosion, closing, segmentation, or the like) may be used. In an example embodiment, a PFM may be arranged by generating, through image processing, evenly spaced contour lines from a central portion of a target region. In an example embodiment, the PFM may be preferentially arranged by detecting fine features requiring precise rendering in the target region through image processing. In an example embodiment, when there are mirror arrangement combinations having the same total cost value after priority assignment, an optimal illumination system may be selected by generating a plurality of mirror arrangement diagrams and applying a symmetry criterion.

Example embodiments may be applied to all products/ layers (for example, DRAM) to which an EUV lithography process is applied. Example embodiments may be applied to an EUV scanner to which an illumination optics system including an FFM and a PFM may be applied. In addition, example embodiments may be applied to all EUV lithography processes.

Figure 10:
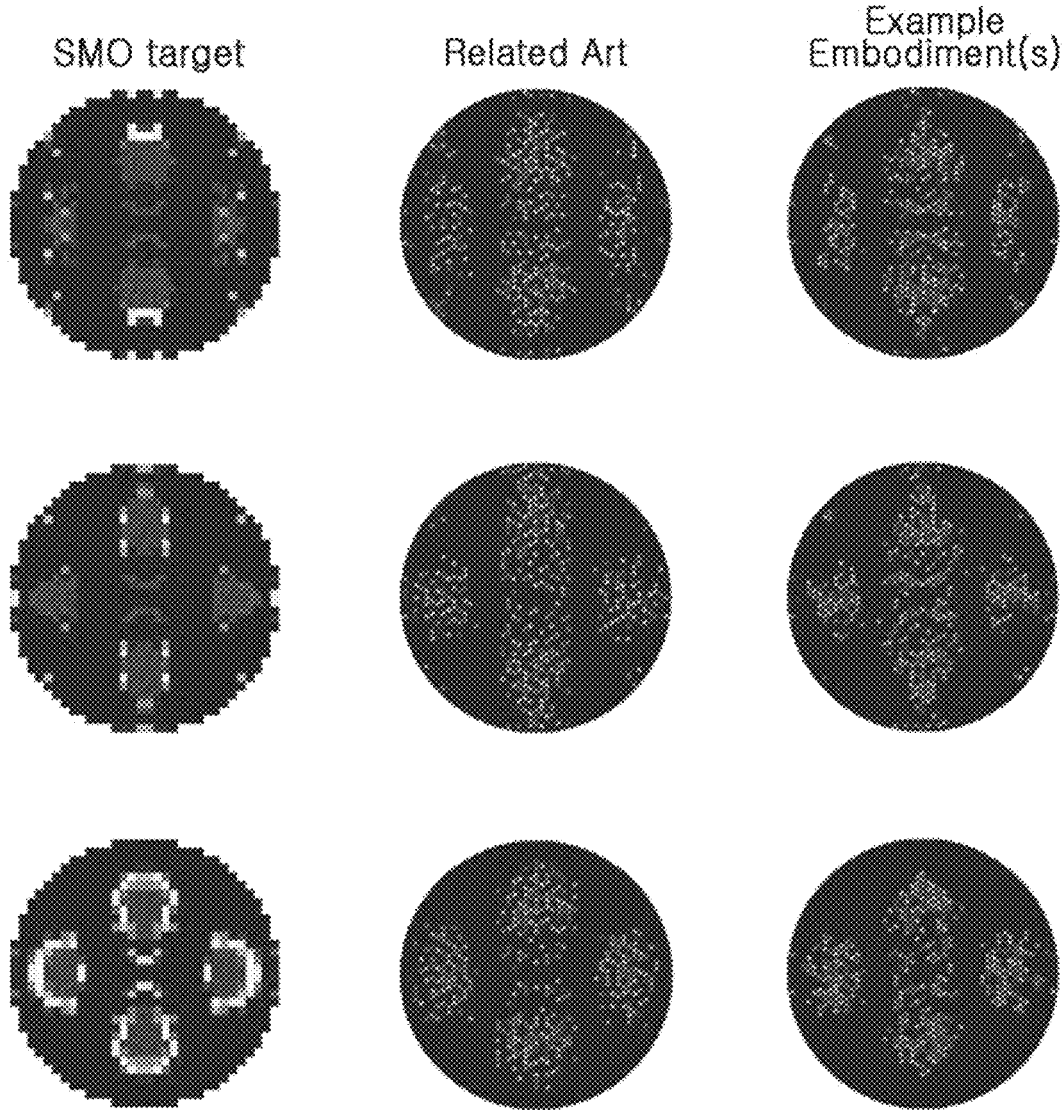
FIG. 10 is a diagram illustrating a comparison between a rendering technique according to example embodiments and a technique according to the related art.

FIG. 10 is a diagram illustrating a comparison between a rendering technique according to example embodiments and a technique according to the related art of an NXE:3400C EUV scanner of ASML. Referring to FIG. 10, comparison diagrams according to SMO are illustrated. Results of rendering in a corresponding manner for each of target inputs generated by SMO of Tachyon software are illustrated. As illustrated in FIG. 10, rendering performance according to an example embodiment may be superior to that according to the related art.

The performance of lithography equipment may be improved using illumination systems generated according to example embodiments, which may be confirmed through results of simulation and on-wafer measurement. When the illumination systems generated according to an example embodiment are applied to a product, it is possible to improve ADI CD in-point uniformity (IPU), ACI CD IPU, DoF, Dose, or the like only with replacement of the illumination system under the same condition without an additional process change. IPU may be an index indicating a variation of CD.

In EUV illumination system rendering according to an example embodiment, a user may designate a priority for each mirror position. In addition, EUV illumination system rendering according to an example embodiment may generate an illumination system having a shape closer to that of an SMO target.

Example embodiments may be applied to an EDA vendor tool having a function of generating an optimal freeform target, which a previous operation of illumination system rendering, and a function of evaluating a generated illumination system, a subsequent operation of illumination system rendering.

A method of operating an EUV lithography device according to an example embodiment may use linear programming including a Hungarian algorithm for EUV illumination system rendering. In an example embodiment, assignment of a subdivided priority in individual PFM units may be used. In an example embodiment, a drawing technique or illumination system simulation (e.g., SMO, NILS map simulation, or the like) may be used. In an example embodiment, high-resolution NILS map simulation using a method of sweeping through a point source may be used. In an example embodiment, image processing (e.g., masking, dilation, erosion, closing, segmentation, or the like) may be used. In an example embodiment, a PFM may be arranged by generating evenly spaced contour lines from a central portion of a target region through image processing. In an example embodiment, the PFM may be preferentially arranged by detecting fine features requiring precise rendering in the target region through image processing. In an example embodiment, when there are mirror arrangement combinations having the same total cost value even after priority assignment, multiple mirror arrangement diagrams may be generated, and then an optimal illumination system may be selected by applying a symmetry criterion (a degree of a position of a central portion being moved when a pattern is vertically or horizontally inverted, or the like).

An EUV lithography device and a method of operating the EUV lithography device according to an example embodiment may render a freeform illumination system capable of improving patterning performance using linear programming and priority assignment.

In the above-described example embodiments, components according to example embodiments are referred to by using blocks. The blocks may be implemented as various hardware devices such as an integrated circuit (IC), an ASIC, a field programmable gate array (FPGA), a complex programmable logic device (CPLD), and the like, firmware running on the hardware devices, software such as application, or in a form in which a hardware device and software combine with each other. In addition, the blocks may include circuits including semiconductor devices in the IC or circuits registered as an intellectual property (IP).

At least one of the components, elements, modules or units (collectively "components" in this paragraph) represented by a block in the drawings may be embodied as various numbers of hardware, software and/or firmware structures that execute respective functions described above. At least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like.

Each of the embodiments provided in the above description is not excluded from being associated with one or more features of another example or another embodiment also provided herein or not provided herein but consistent with the disclosure.

While example embodiments have been shown and described above, it will be apparent to those skilled in the art that modifications and variations could be made without departing from the scope of example embodiments as defined by the appended claims.

What is claimed is:

1. An operating method of an extreme ultraviolet (EUV) lithography device, the method comprising:
   defining a target image to render an illumination system;
   assigning priorities to respective positions of facets of a pupil facet mirror corresponding to the target image, wherein the assigning priorities to the respective positions of the facets of the pupil facet mirror comprises assigning a value to each position of the facets of the pupil facet mirror;
   assigning a mirror according to the assigned priorities using linear programming based on the assigned values to each position of the facets of the pupil facet mirror;
   generating the illumination system by selecting one of the facets of the pupil facet mirror based on a symmetry criterion; and
   converting mirror assignment information and source map information corresponding to the selected facet into a form recognizable by an EUV scanner.

2. The method of claim 1, wherein the defining the target image comprises acquiring the target image based on a drawing technique or source mask optimization (SMO).

3. The method of claim 1, wherein the assigning priorities comprises determining a subdivided priority of the assigned priorities by processing the target image.

4. The method of claim 1, wherein the linear programming is performed based on a Hungarian algorithm.

5. The method of claim 1, wherein the assigning the mirror comprises generating a cost matrix according to the assigned priorities.

6. The method of claim 5, wherein the generating the cost matrix comprises:
   generating a basic cost matrix based on illumination channel group information; and
   updating the basic cost matrix based on the values corresponding to each position of the facets of the pupil facet mirror.

7. The method of claim 1, wherein the assigning the mirror comprises:
   optimizing a total cost based on a Hungarian algorithm; and
   identifying a field facet mirror corresponding to the optimized total cost.

8. The method of claim 7, wherein, based on one mirror arrangement combination having the optimized total cost, the converting into the form recognizable by the EUV scanner is performed without performing the selecting of the one of the facets.

9. The method of claim 7, wherein, based on a plurality of mirror arrangement combinations having the optimized total cost, the selecting one of the facets of the pupil facet mirror comprising:
   generating a plurality of mirror arrangement diagrams by randomizing and sampling a pupil facet mirror order of a cost matrix; and
   selecting one of the plurality of mirror arrangement diagrams as an optimal illumination system based on the symmetry criterion.

10. The method of claim 1, wherein the converting into the form recognizable by the EUV scanner comprises generating an illumination system file according to an xml format based on the mirror assignment information and the source map information.

11. An extreme ultraviolet (EUV) lithography device comprising:
   an EUV light source;
   a first optical system comprising a freeform illumination system and configured to receive EUV light from the EUV light source and incident the EUV light on an EUV mask;
   a second optical system configured to receive the EUV light reflected from the EUV mask and incident the reflected EUV light on a wafer;
   a mask stage on which the EUV mask is provided;
   a wafer stage on which the wafer is provided; and
   a controller configured to:
      control the mask stage and the wafer stage, and
      render the freeform illumination system by:
         assigning priorities to respective positions of the facets of pupil facet mirror by assigning a value to each position of the facets of the pupil facet mirror, and assigning, using linear programming, a field facet mirror to the pupil facet mirror based on the assigned values to each position of the facets of the pupil facet mirror.

12. The EUV lithography device of claim 11, wherein the controller is further configured to process a target image corresponding to the freeform illumination system by one of masking, dilation, erosion, and closing.

13. The EUV lithography device of claim 12, wherein the controller is further configured to assign the pupil facet mirror by generating evenly spaced contour lines from a central portion of the processed target region.

14. The EUV lithography device of claim 12, wherein the controller is further configured to assign pupil facet mirror by detecting fine features requiring rendering in the processed target region.

15. The EUV lithography device of claim 11, wherein, based on a plurality of mirror arrangement combinations having a same total cost after a priority is assigned, the controller is further configured to:
   generate a plurality of mirror arrangement diagrams, and
   select an illumination system from among the plurality of mirror arrangement diagrams based on a symmetry criterion.

16. An extreme ultraviolet (EUV) lithography device comprising:
   an EUV light source;
   a field facet mirror configured to reflect light from the EUV light source;
   a pupil facet mirror configured to receive light reflected from the field facet mirror and reflect the received light to a mask; and
   a controller configured to:
      assign a priority to the pupil facet mirror based on a target image corresponding to a rendering of an illumination optical system by assigning a value to each position of facets of the pupil facet mirror, and
      assign the field facet mirror as the pupil facet mirror to which the priority is assigned using linear programming based on the assigned values to each position of the facets of the pupil facet mirror.

17. The EUV lithography device of claim 16, wherein the controller is further configured to acquire a target image by converting an output image of source mask optimization (SMO) into pupil facet mirror coordinates.

18. The EUV lithography device of claim 16, wherein the controller is further configured to render the illumination optical system by:
   generating a cost matrix corresponding to the pupil facet mirror according to the priority; and
   searching for a field facet mirror corresponding to an optimized total cost by optimizing a total cost based on the cost matrix and the linear programming.

19. The EUV lithography device of claim 18, wherein the controller is further configured to, based on one mirror arrangement combination having the optimized total cost, generate an illumination system file based on mirror assignment information and source information.

20. The EUV lithography device of claim 18, wherein based on a plurality of mirror arrangement combinations having the optimized total cost, the controller is further configured to:
   generate a plurality of mirror arrangement diagrams after an order of pupil facet mirrors of the cost matrix is randomized,
   select one of the plurality of mirror arrangement diagrams as a final illumination system based on a symmetry criterion, and
   generate an illumination system file based on mirror assignment information and source information.

* * * * *